(12) United States Patent
Grundmann et al.

(10) Patent No.: US 8,390,592 B2
(45) Date of Patent: Mar. 5, 2013

(54) DETECTION SYSTEM FOR APPROACH RECOGNITION

(75) Inventors: Holmer-Geert Grundmann, Babenhausen (DE); Guido Meier-Arendt, Langen (DE)

(73) Assignee: Continental Automotive GmbH, Hannover (DE)

( * ) Notice: Subject to any disclaimer, the term of this patent is extended or adjusted under 35 U.S.C. 154(b) by 272 days.

(21) Appl. No.: 12/995,857

(22) PCT Filed: May 28, 2009

(86) PCT No.: PCT/EP2009/056546
§ 371 (c)(1),
(2), (4) Date: Dec. 2, 2010

(87) PCT Pub. No.: WO2009/147062
PCT Pub. Date: Dec. 10, 2009

(65) Prior Publication Data
US 2011/0141063 A1    Jun. 16, 2011

(30) Foreign Application Priority Data
Jun. 3, 2008 (DE) .......................... 10 2008 026 488

(51) Int. Cl.
*G09G 5/00* (2006.01)

(52) U.S. Cl. ........................................ 345/173; 345/175
(58) Field of Classification Search .......... 345/173–175, 345/177; 178/18.01, 18.03–18.11
See application file for complete search history.

(56) References Cited

U.S. PATENT DOCUMENTS

| | | | |
|---|---|---|---|
| 5,844,500 | A | 12/1998 | Beuk et al. |
| 6,324,453 | B1 | 11/2001 | Breed et al. |
| 6,411,202 | B1 | 6/2002 | Gal et al. |
| 7,401,532 | B2 | 7/2008 | Wanami |
| 7,786,980 | B2 | 8/2010 | Lashina |
| 2008/0231603 | A1 | 9/2008 | Parkinson et al. |

FOREIGN PATENT DOCUMENTS

| | | |
|---|---|---|
| DE | 4121180 A1 | 1/1993 |
| DE | 10 2006 014 061 A1 | 10/2006 |
| DE | 10 2006 028 046 A1 | 12/2007 |
| WO | WO 98/50258 A1 | 11/1998 |
| WO | WO 00/38949 A2 | 7/2000 |
| WO | WO 2005/073834 A2 | 8/2005 |
| WO | WO 2006/003590 A2 | 1/2006 |
| WO | WO 2007/006514 A1 | 1/2007 |

*Primary Examiner* — Regina Liang
(74) *Attorney, Agent, or Firm* — Cozen O'Connor

(57) ABSTRACT

A detection system for the approach recognition of a hand or arm movement in the direction a display or control unit. The detection takes place in two stages by way of long-range detection and close-range detection. The first stage detects using at least one optical or acoustic sensor.

20 Claims, 2 Drawing Sheets evaluation Unit 11

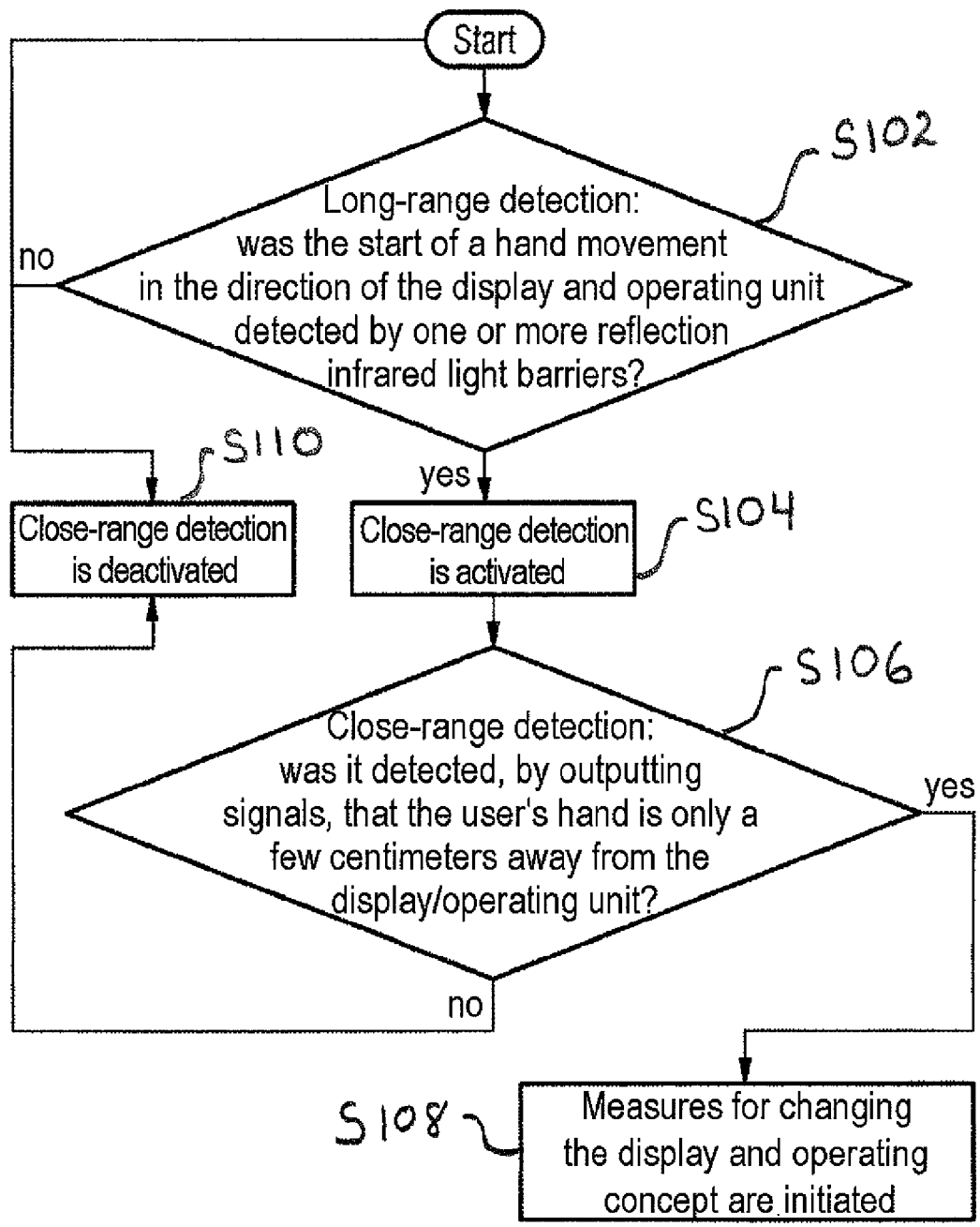

DETECTION SYSTEM FOR APPROACH RECOGNITION

PRIORITY CLAIM

This is a U.S. national stage of Application No. PCT/EP2009/056546, filed on May 28, 2009, which claims priority to German Application No: 10 2008 026 488.1, filed: Jun. 3, 2008, the contents of which are incorporated herein by reference.

BACKGROUND OF THE INVENTION

1. Field of the Invention

The invention relates to a detection system for recognizing the approach of a hand or arm movement in a direction towards a display and operating unit, detection being carried out in two stages.

2. Related Art

Proximity and touch sensors are being used more and more often in the interior of vehicles to optimize interaction between a user and an information and assistance system in a user-friendly manner. In this case, gestures or approaches are detected and analyzed. This is effected by generating a physical measurement variable and converting the physical measured variable into an electrical signal. An action is then triggered using a control device.

To support interaction between a user and an information system, a few systems are known that detect when a display or an operating element is approached and/or allow the driver and passenger to be differentiated. The display and operating concept is then changed in a manner adapted to the context based on the detection result. Approach detection apparatuses are cited in a few documents.

The document WO 2007/006514 A1 discloses an approach detection apparatus having a transmitting and receiving unit. In this case, the apparatus operates optoelectronically in an area outside the vehicle. When a person approaches from a predetermined, central direction, a control signal is triggered in a close range of the vehicle using a code transmitter carried by the person.

Detection in known apparatuses is carried out in a defined detection range in the close range of a display or an operating unit. Signals are permanently injected into the user by using capacitive sensors.

The known apparatuses and methods have the disadvantage that the user must carry a transmitting unit or a code transmitter, in the form of a chip card, or a transmitting unit integrated in the car key in order to trigger a control signal. Furthermore, a large amount of energy is required as a result of signals being permanently injected into the human body. Detection devices may be perceived to be harmful to health by the user as a result of the permanent signal injection, that is to say as a result of the user being exposed to magnetic and/or electric fields.

SUMMARY OF THE INVENTION

One embodiment of the invention is based on providing a detection system for approach recognition that does not require a transmitting unit at the user end, operates in an energy-saving manner, and minimizes the injection of signals into the human body.

The claimed detection system for vehicles for recognizing the approach of a hand or arm movement in the direction of a display and operating unit in the vehicle interior has two-stage detection. The first stage comprises long-range detection by at least one optical or acoustic sensor, and the second stage comprises close-range detection by injecting and outputting signals using a capacitive sensor. The system is configured such that long-range detection automatically triggers close-range detection when a hand or arm movement changes to the close range.

The method for operating a detection system for vehicles, in particular for vehicle interiors, for recognizing the approach of a hand or arm movement in the direction of a display and operating unit, detection being carried out in two stages, and long-range detection beginning with the start of a hand or arm movement in the direction of the display and operating unit and long-range detection automatically triggering close-range detection when the movement changes from the long range to the close range.

An energy-saving method is achieved by subdividing the detection operation into a close range and a long range. When a user enters the long range, the approach is recognized by optical sensors operate in a particularly energy-saving manner with respect to other sensors, and control commands and system/user dialogs which use more energy are executed only when the close range is entered. If a user leaves the long range again before having advanced into the close range, no dialog is arranged and the system remains in a mode which requires a small amount of energy.

According to one embodiment of the invention, the sensors in the first detection stage may be reflection infrared light barriers or ultrasonic sensors. This has the advantage that these sensors are suitable for the relatively short range of less than half a meter in the vehicle interior as a result of the use of short wavelengths in the millimeter range and below. The long range may have a user/display distance of 10 cm to half a meter. In this case, it must be ensured, particularly in the case of short distances, that the sensor used must always be fast enough to switch the close-range sensor when the close range is entered. The exact distance units for the lose and long ranges are dependent on the type of vehicle and can be set accordingly. The long-range sensor is preferably arranged on the roof lining, for example close to the reading light or the rearview mirror or in the region of the display and operating element.

In one preferred exemplary embodiment, the first detection stage (long-range detection) begins with the start of an arm or hand movement in the direction of the display and operating unit. According to one embodiment of the invention, this activates a second detection stage which detects the movement in the close range of the display and operating unit by injecting signals into the arm or the hand and the corresponding capacitive output of signals. The close-range sensor is in the form of a proximity switch. The function of the capacitive proximity switch is based on the change in the electric field in the surrounding area in front of its sensor electrode, for example caused by an arm or a hand entering the close range of the display and operating element, which range is covered by this sensor. Measures for adapting the display and operating concept are initiated as a result of the detection. Approaching the system triggers a control command. Examples of this may be changes in the appearance of the display and operating area, deliberate enabling or blocking of functions for the driver and/or passenger or assignment of functions to the driver or passenger.

In one preferred embodiment of the present invention, there is no need for a code transmitter for triggering signals. Solely approaching the close range of the display and operating unit already results in the control command being executed.

According to the invention, the display and operating unit may be in the form of a touch screen and may be arranged in the center console of a vehicle.

The two-stage detection according to one embodiment of the invention dispenses with the practice of permanently injecting signals into the user, in particular in the close range.

The first approach recognition stage activates user-specific close-range recognition. User-specific contents can thus be displayed early on. By the nature of the system, early recognition of the operator makes it possible to shorten latency times to user inputs.

BRIEF DESCRIPTION OF DRAWINGS

The detection system for approach recognition shall be explained in more detail using a few exemplary embodiments. In this case:

FIG. 3 is a flowchart of the two-stage approach detection.

DETAILED DESCRIPTION OF THE DRAWINGS

Figure 1:
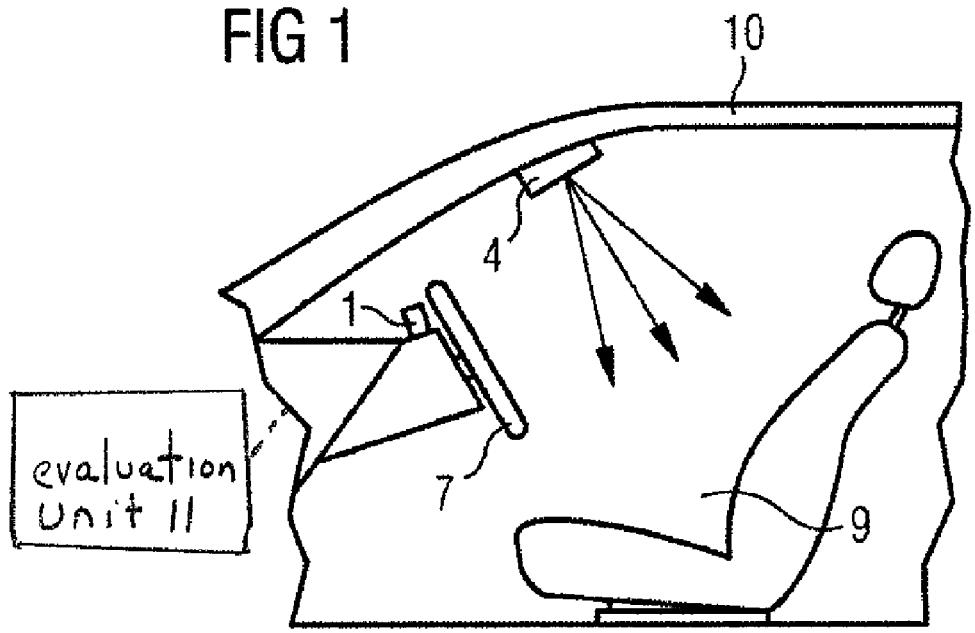
FIG. 1 is a first approach detection stage (long-range detection)

FIG. 1 shows the first approach detection stage (long-range detection) in a vehicle interior 9 by at least one optical sensor 4 in the form of a reflection infrared light barrier. The display and operating unit 1 is in the form of a touch screen 7 or another monitor and is situated in the center console 8 of the vehicle. The reflection light barrier is at the height of the rearview mirror on the roof 10 of the vehicle. The first detection stage is likewise possible using an ultrasonic sensor. Long-range detection begins immediately with a hand or arm movement 5 in the direction of the display and operating unit 1. The long range can be set between a few centimeters and half a meter in the vehicle interior 9.

Upon passing through the light barrier, the light signal or ultrasonic signal reflected by the user is picked up by a receiver in the reflection light barrier and is evaluated in an evaluation unit 11 to determine whether the approach movement continues in the direction of the display and operating unit 1 or is terminated. The close range signal transmission sensors 12 for the activated upon leaving the long range and entering the close range. A skillful arrangement of the reflection light barrier makes it possible to record the start of the movement and to already begin detection at an early stage of movement.

Figure 2:
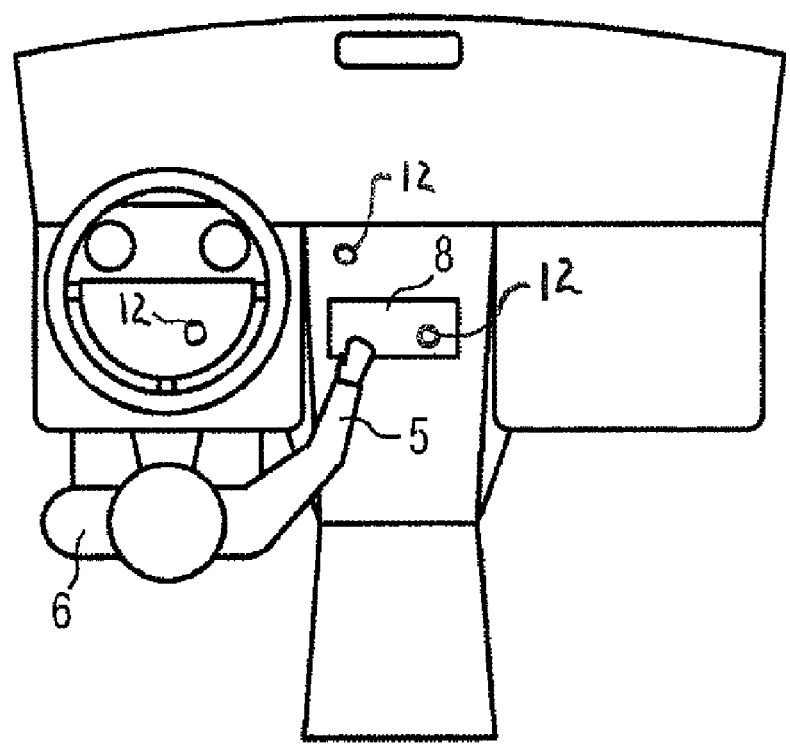
FIG. 2 is a second approach detection stage (close-range detection)

FIG. 2 shows the second approach detection stage (close-range detection). Detection in the close range of the display and operating unit 1 is carried out by injecting signals into the human body 6. Detection is carried out in the close range using a capacitive distance sensor 12. The capacitive distance sensor 12 converts the variable to be monitored (the distance in this case) into a signal to be processed further. The function is based on the change in the electric field in the area surrounding the active zone, that is to say the close range. The capacitance in the electric field of the sensor changes as a result of an arm or a hand 5 approaching in the direction of the display and operating element 1. As a result of this change, a control command is emitted to the display and operating unit 1. The display and operating concept is adapted in a user-determined manner, that is to say the display and operating system 1 switches to the driver or passenger mode with the corresponding information in the second detection stage depending on the direction from which the first signal strikes the receiver.

FIG. 3 is a flowchart of one embodiment of the two-stage approach detection. The process begins with long-range detection of a hand movement 5 in the direction of a display and operating unit 1 using reflection infrared light barriers (S102). If such a movement is recognized, close-range detection is activated (S104) if movement continues into the close range (S106).

Measures for changing the display and operating concept are initiated if the hand 5 of the user 6 was detected a few centimeters in front of the display and operating unit 1 by signal injection (S108). Withdrawing the user's hand 5 causes detection to fail and close-range detection is deactivated (S110). Long-range detection begins again (S102).

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A detection system for vehicles configured to recognize an approach of an appendage in a direction of an operating unit, comprising:
    a long range detector comprising at least one of: at least one optical sensor and at least one acoustic sensor configured for long range detection at a first distance from the operating unit;
    a close range detector configured for close range detection at a second distance from the operating unit configured for short range detection at the second distance from the operating unit, the second distance being less than the first distance; and
    an evaluation unit, configured such that the long-range detection automatically triggers the close-range detection when the appendage moves from the long range to the short range.

2. The system as claimed in claim 1, wherein the at least one optical sensor is a reflection infrared light barrier.

3. The system as claimed in claim 1, wherein the at least one acoustic sensor is an ultrasonic sensor.

4. The system as claimed in claim 1, wherein the long range, as measured between the operating unit and a user, is between about 1 and 50 cm.

5. The system as claimed in claim 1, wherein the display and operating unit further comprises a display.

6. The system as claimed in claim 5, wherein the display and operating unit is integrated in a center console of a vehicle.

7. The system as claimed in claim 5, wherein the display is a touch screen.

8. The system as claimed in claim 1, wherein the operating unit is integrated in a center console of a vehicle.

9. A method for operating a detection system for vehicles for recognizing an approach of an appendage in a direction of an operating unit in a vehicle interior, the system perfoming two-stage detection in which a long-range detector comprises at least one of at least one optical sensor and at least one acoustic sensor, the method comprising:
- beginning long-range detection with a detection of movement of the appendage in the direction of the operating unit;
- triggering close-range detection automatically as a result of the appendage movement directly approaching the operating unit.

10. The method as claimed in claim 9, further comprising: triggering a change in the operating concept as a result of the operating unit being approached in the close range.

11. The method as claimed in claim 10, further comprising: setting the operating unit in a user-specific manner to at least one of a driver and a passenger based at least in part on the long-range detection recognizing a direction from which the operating unit is approached.

12. The method as claimed in claim 9, wherein the operating unit is set in a user-specific manner to at least one of a driver and a passenger by the long-range detection recognizing a direction from which the operating unit is approached.

13. The method as claimed in claim 12, wherein appendage is a hand or an arm and the long-range detection begins with an immediate start of the appendage movement in the direction of the operating unit.

14. The method as claimed in claim 9, wherein appendage is a hand or an arm and the long-range detection begins with an immediate start of the appendage movement in the direction of the operating unit.

15. The method as claimed in claim 14, further comprising: adapting an operating concept of the operating unit based at least in part on the close-range detection.

16. The method as claimed in claim 9, further comprising: adapting an operating concept of the operating unit based at least in part on the close-range detection.

17. The method as claimed in claim 16, wherein the close-range detection is performed by at least one capacitive sensor.

18. The method as claimed in claim 9, wherein the close-range detection is performed by at least one capacitive sensor.

19. The method as claimed in claim 18, further comprising capacitively injecting a signal to perform close-range detection.

20. The method as claimed in claim 9, further comprising capacitively injecting a signal to perform close-range detection.

* * * * *